United States Patent
Huang et al.

(10) Patent No.: US 12,274,088 B2
(45) Date of Patent: *Apr. 8, 2025

(54) SEMICONDUCTOR STRUCTURE

(71) Applicant: NANYA TECHNOLOGY CORPORATION, New Taipei (TW)

(72) Inventors: Chih-Wei Huang, New Taipei (TW); Hsu-Cheng Fan, New Taipei (TW); En-Jui Li, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/608,957

(22) Filed: Mar. 19, 2024

(65) Prior Publication Data
US 2024/0222454 A1 Jul. 4, 2024

Related U.S. Application Data

(60) Continuation of application No. 18/348,334, filed on Jul. 6, 2023, now Pat. No. 11,967,628, which is a (Continued)

(51) Int. Cl.
*H10D 64/27* (2025.01)
*H01L 21/3213* (2006.01)
(Continued)

(52) U.S. Cl.
CPC ..... *H10D 64/513* (2025.01); *H01L 21/32139* (2013.01); *H10B 12/053* (2023.02);
(Continued)

(58) Field of Classification Search
CPC ............ H01L 29/4236; H01L 29/7825; H01L 29/66621; H01L 21/823437;
(Continued)

(56) References Cited

U.S. PATENT DOCUMENTS 5,082,795 A 1/1992 Temple
5,508,534 A 4/1996 Nakamura et al.
(Continued)

FOREIGN PATENT DOCUMENTS

| CN | 103377953 A | * 10/2013 | ......... H01L 29/0607 |
|----|-------------|-----------|------------------------|
| CN | 107799582 A | * 3/2018 | ......... H01L 29/0607 |
| TW | 201906089 A | 2/2019 | |

*Primary Examiner* — Joseph C. Nicely
(74) *Attorney, Agent, or Firm* — CKC & Partners Co., LLC

(57) ABSTRACT

A semiconductor structure includes a substrate, an isolation layer, a dielectric layer, an insulation layer, a conductor and a capping layer. The substrate has a concave portion. The isolation layer is located on a top surface of the substrate. The dielectric layer is located on the isolation layer. The insulation layer is located on a surface of the concave portion and extends to a sidewall of the isolation layer. The conductor is located on the insulation layer in the concave portion. The conductor has a first top surface and a second top surface, and the first top surface is closer to the dielectric layer than the second top surface. The capping layer is located in the concave portion and covers the conductor.

10 Claims, 12 Drawing Sheets

Related U.S. Application Data division of application No. 17/381,191, filed on Jul. 21, 2021, now Pat. No. 11,742,402.

(51) Int. Cl.
| | |
|---|---|
| *H10B 12/00* | (2023.01) |
| *H10D 30/65* | (2025.01) |
| *H10D 64/01* | (2025.01) |
| *H10D 84/01* | (2025.01) |
| *H10D 84/03* | (2025.01) |
| *H01L 21/3105* | (2006.01) |

(52) U.S. Cl.
CPC ........... *H10B 12/34* (2023.02); *H10D 30/658* (2025.01); *H10D 64/01* (2025.01); *H10D 64/027* (2025.01); *H10D 84/0135* (2025.01); *H10D 84/038* (2025.01); *H01L 21/31058* (2013.01); *H10B 12/00* (2023.02)

(58) Field of Classification Search
CPC .... H10B 12/053; H10B 12/34; H10D 30/658; H10D 64/513; H10D 64/027
See application file for complete search history.

(56) References Cited

U.S. PATENT DOCUMENTS

| | | | |
|---|---|---|---|
| 7,732,849 B2 | 6/2010 | Liu | |
| 9,972,626 B1 | 5/2018 | Takesako et al. | |
| 11,742,402 B2 * | 8/2023 | Huang | H10B 12/053 257/330 |
| 2005/0161734 A1 | 7/2005 | Miyata et al. | |
| 2006/0270150 A1 | 11/2006 | Lee | |
| 2007/0264772 A1 | 11/2007 | Lee et al. | |
| 2008/0070373 A1 | 3/2008 | Huang | |
| 2009/0008691 A1 | 1/2009 | Lee et al. | |
| 2009/0140307 A1 | 6/2009 | Baar et al. | |
| 2010/0090348 A1 | 4/2010 | Park et al. | |
| 2010/0327337 A1 * | 12/2010 | Yang | H10B 12/053 257/334 |
| 2012/0012925 A1 | 1/2012 | Oh | |
| 2012/0119285 A1 * | 5/2012 | Yang | H01L 29/66621 257/329 |
| 2013/0037882 A1 * | 2/2013 | Kim | H01L 29/4236 257/E29.264 |
| 2014/0063934 A1 * | 3/2014 | Oh | H10B 12/34 365/182 |
| 2014/0291754 A1 | 10/2014 | Lee et al. | |
| 2015/0263009 A1 | 9/2015 | Oh et al. | |
| 2016/0172488 A1 | 6/2016 | Oh et al. | |
| 2017/0125532 A1 | 5/2017 | Jang | |

* cited by examiner

SEMICONDUCTOR STRUCTURE

CROSS-REFERENCE TO RELATED APPLICATION

The present application is a Continuation Application of the U.S. application Ser. No. 18/348,334, filed Jul. 6, 2023, which is a Divisional Application of the U.S. application Ser. No. 17/381,191, filed Jul. 21, 2021, now U.S. Pat. No. 11,742,402, issued Aug. 29, 2023, which are herein incorporated by reference in its entirety.

BACKGROUND

Field of Invention

The present disclosure relates to a manufacturing method of a semiconductor structure.

Description of Related Art

In general, recessed access device (RAD) is used in dynamic random-access memory (DRAM). A top surface of a conductor of the recessed access device is normally flat, and a capping layer is formed on the top surface of the conductor. The conductor and the capping layer have corresponding proportions in a concave portion of the substrate. For example, when the proportion of the conductor is larger, the proportion of the capping layer is smaller. However, when the top surface of the conductor is flat and the proportion of the conductor is larger, the recessed access device is more likely to produce gate-induced drain leakage (GIDL) problems. On the other hand, when the proportion of the capping layer is larger, since the capping layer has a higher resistance than the conductor, the recessed access device has high resistance feature, which is disadvantageous to subsequent applications.

SUMMARY

An aspect of the present disclosure is related to a semiconductor structure.

According to an embodiment of the present disclosure, a semiconductor structure includes a substrate, an isolation layer, a dielectric layer, an insulation layer, a conductor and a capping layer. The substrate has a concave portion. The isolation layer is located on a top surface of the substrate. The dielectric layer is located on the isolation layer. The insulation layer is located on a surface of the concave portion and extends to a sidewall of the isolation layer. The conductor is located on the insulation layer in the concave portion. The conductor has a first top surface and a second top surface, and the first top surface is closer to the dielectric layer than the second top surface. The capping layer is located in the concave portion and covers the conductor.

In an embodiment of the present disclosure, a width of the first top surface of the conductor is greater than a width of the second top surface.

In an embodiment of the present disclosure, the conductor has an internal sidewall adjoining the first top surface and the second top surface, and the first top surface, the second top surface and the internal sidewall define a stepped surface.

In an embodiment of the present disclosure, a distance between the first top surface of the conductor and the second top surface is greater than a distance between the second top surface of the conductor and a bottom of the conductor.

In an embodiment of the present disclosure, an external sidewall of the conductor adjoining the first top surface is in contact with the insulation layer.

In an embodiment of the present disclosure, the capping layer has a top surface and a first bottom surface located on the first top surface, and a distance between the top surface of the capping layer and the first bottom surface is less than a distance between the first top surface of the conductor and the second top surface.

In an embodiment of the present disclosure, the capping layer has a second bottom surface located on the second top surface, and a distance between the top surface of the capping layer and the second bottom surface is greater than a distance between the first top surface of the conductor and the second top surface.

In an embodiment of the present disclosure, a width of the first bottom surface of the capping layer is greater than a width of the second bottom surface.

In an embodiment of the present disclosure, the capping layer is located beneath the dielectric layer.

In an embodiment of the present disclosure, an external sidewall of the capping layer is in contact with the insulation layer.

An aspect of the present disclosure is related to a manufacturing method of a semiconductor structure.

According to an embodiment of the present disclosure, a manufacturing method of a semiconductor structure includes forming a concave portion in a substrate, wherein an isolation layer is located on the substrate, and a dielectric layer is located on the isolation layer; forming an insulation layer on the dielectric layer and in the concave portion; forming a conductor on the insulation layer; etching the conductor such that the conductor is located in the concave portion; forming a sacrificial layer on the dielectric layer, the insulation layer and the conductor; implanting a first portion of the sacrificial layer, wherein the sacrificial layer has a second portion that is not implanted; removing the first portion of the sacrificial layer such that the sacrificial layer has an opening exposing the conductor; and etching the second portion of the sacrificial layer and the conductor such that the conductor has a first top surface and a second top surface, wherein the second top surface corresponds to the opening of the sacrificial layer in position, the first top surface corresponds to the second portion of the sacrificial layer in position, and the first top surface is closer to the dielectric layer than the second top surface.

In an embodiment of the present disclosure, after the sacrificial layer is implanted, the first portion and the second portion of the sacrificial layer have different etching rates.

In an embodiment of the present disclosure, the sacrificial layer is formed on the dielectric layer, the insulation layer and the conductor by tetraethoxysilane (TEOS).

In an embodiment of the present disclosure, the sacrificial layer is implanted by tilt implanting such that the first portion and the second portion of the sacrificial layer have different etching rates.

In an embodiment of the present disclosure, the method further includes forming a capping layer on the conductor and the dielectric layer.

In an embodiment of the present disclosure, the method further includes etching the capping layer such that a top surface of the capping layer is located in the concave portion.

In an embodiment of the present disclosure, the capping layer is etched such that a distance between the top surface of the capping layer and the first top surface of the conductor is less than a distance between the top surface of the capping layer and the second top surface of the conductor.

In an embodiment of the present disclosure, the isolation layer and the dielectric layer have different materials.

In an embodiment of the present disclosure, the method further includes forming the isolation layer and the dielectric layer on a top surface of the substrate prior to forming the concave portion in the substrate and patterning the isolation layer and the dielectric layer to form an opening corresponding to the concave portion in position.

In an embodiment of the present disclosure, the conductor is formed on the insulation layer such that the conductor covers a top surface of the substrate.

In the aforementioned embodiments of the present disclosure, because the conductor of the semiconductor structure has the first top surface, the second top surface, and the internal sidewall adjoining the first and second top surfaces, and the first top surface is closer to the dielectric layer than the second top surface, the first top surface, the second top surface and the internal sidewall form the stepped surface. The stepped surface of the semiconductor structure may reduce gate-induced drain leakage (GIDL). In addition, compared with traditional technologies, the concave portion of the substrate of the semiconductor structure has the conductor with more proportions, so the semiconductor structure has low resistance feature, which is advantageous to the subsequent applications.

DETAILED DESCRIPTION

Figure 1:
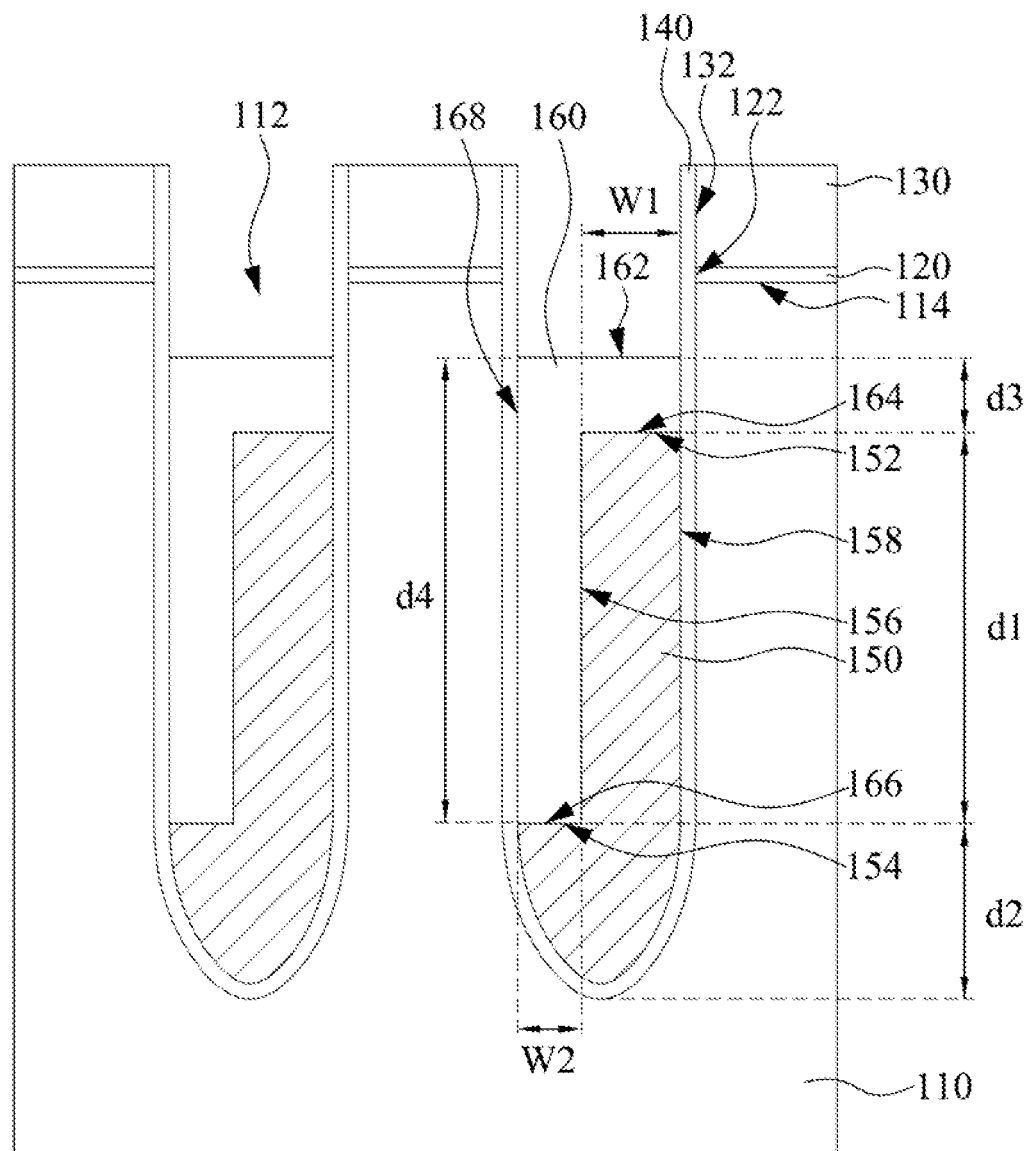
FIG. 1 illustrates a cross-sectional view of a semiconductor structure according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper," "front," "back" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a cross-sectional view of a semiconductor structure 100 according to one embodiment of the present disclosure. The semiconductor structure 100 includes a substrate 110, an isolation layer 120, a dielectric layer 130, an insulation layer 140, a conductor 150 and a capping layer 160. The substrate 110 has a concave portion 112. The isolation layer 120 is located on a top surface 114 of the substrate 110. For example, the isolation layer 120 may be made of a material including titanium nitride (TiN), but the present disclosure is not limited in this regard. The dielectric layer 130 is located on the isolation layer 120. The dielectric layer 130 may be made of a material including silicon nitride (SiN), but the present disclosure is not limited in this regard. The isolation layer 120 and the dielectric layer 130 have different materials.

The insulation layer 140 is located on a surface of the concave portion 112 of the substrate 110 and extends to a sidewall 122 of the isolation layer 120 and a sidewall 132 of the dielectric layer 130. The conductor 150 is located on the insulation layer 140 in the concave portion 112 of the substrate 110. The conductor 150 has a first top surface 152 and a second top surface 154, and the first top surface 152 is closer to the dielectric layer 130 than the second top surface 154. The capping layer 160 is located in the concave portion 112 of the substrate 110 and covers the conductor 150.

In one embodiment, a width w1 of the first top surface 152 of the conductor 150 of the semiconductor structure 100 is greater than a width w2 of the second top surface 154 of the conductor 150. In addition, the conductor 150 of the semiconductor structure 100 has an internal sidewall 156 adjoining to the first top surface 152 and the second top surface 154, and the first top surface 152, the second top surface 154 and the internal sidewall 156 define a stepped surface.

Since the conductor 150 of the semiconductor structure 100 has the first top surface 152 and the second top surface 154, and the first top surface 152 is closer to the dielectric layer 130 than the second top surface 154, the first top surface 152, the second top surface 154 and the internal sidewall 156 form the stepped surface. The stepped surface of the semiconductor structure 100 may reduce gate-induced drain leakage (GIDL). In addition, compared with traditional technologies, the concave portion 112 of the substrate 110 of the semiconductor structure 100 has the conductor 150 with more proportions, so the semiconductor structure 100 has a feature of low resistance, which is advantageous to the subsequent applications.

A distance d1 between the first top surface 152 of the conductor 150 of the semiconductor structure 100 and the second top surface 154 is greater than a distance d2 between the second top surface 154 of the conductor 150 and a bottom of the conductor 150. In addition, an external sidewall 158 of the conductor 150 adjoining the first top surface 152 is in contact with the insulation layer 140.

In one embodiment, the capping layer 160 of the semiconductor structure 100 has a top surface 162 and a first bottom surface 164 on the first top surface 152 of the conductor 150. A distance d3 between the top surface 162 of the capping layer 160 and the first bottom surface 164 is smaller than the distance d1 between the first top surface 152 of the conductor 150 and the second top surface 154. In addition, the capping layer 160 of the semiconductor structure 100 has a second bottom surface 166 on the second top surface 154 of the conductor 150, and a distance d4 between the top surface 162 of the capping layer 160 and the second bottom surface 166 is greater than the distance d1 between the first top surface 152 of the conductor 150 and the second top surface 154. For example, the distance d4 between the top surface 162 and the second bottom surface 166 of the capping layer 160 is equal to a sum of the distance d1 between the first top surface 152 and the second top surface 154 of the conductor 150 and the distance d3 between the top surface 162 and the first bottom surface 164 of the capping layer 160.

The first top surface 152 of the conductor 150 of the semiconductor structure 100 corresponds to the first bottom surface 164 of the capping layer 160 in position, and the second top surface 154 of the conductor 150 corresponds to the second bottom surface 166 of the capping layer 160 in position. Therefore, the width w1 of the first bottom surface 164 of the capping layer 160 is greater than the width w2 of the second bottom surface 166 of the capping layer. The capping layer 160 of the semiconductor structure 100 is located beneath the dielectric layer 130, and an external sidewall 168 of the capping layer 160 is in contact with the insulation layer 140.

In the following description, a method of forming the semiconductor structure 100 will be described. It is to be noted that the connection relationship of the aforementioned elements will not be repeated.

Figure 2:
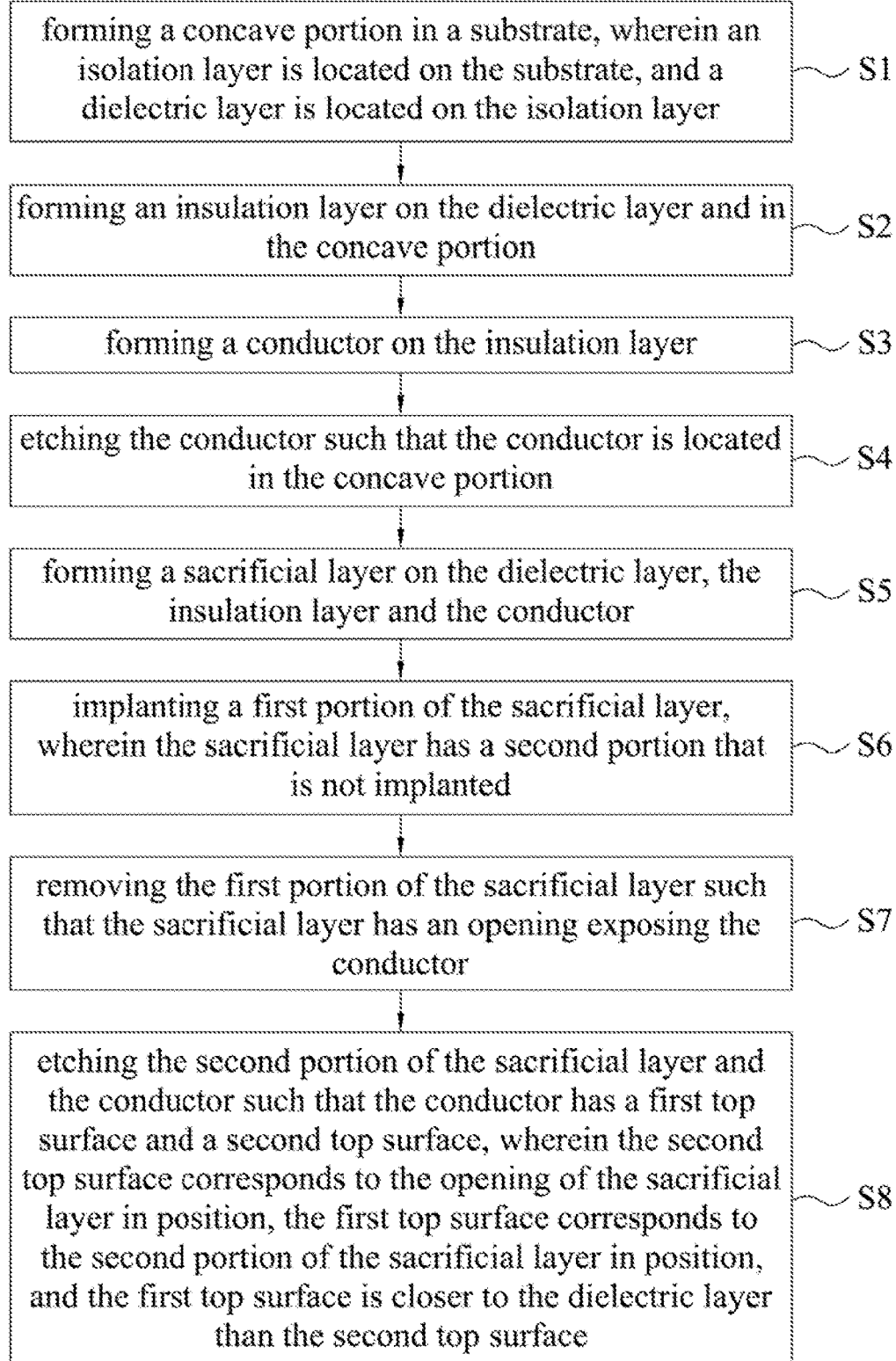
FIG. 2 illustrates a flow chart of a manufacturing method of a semiconductor structure according to one embodiment of the present disclosure.

FIG. 2 illustrates a flow chart of a manufacturing method of a semiconductor structure according to one embodiment of the present disclosure. The manufacturing method of the semiconductor structure includes steps as outlined below. In step S1, a concave portion is formed in a substrate, wherein an isolation layer is located on the substrate, and a dielectric layer is located on the isolation layer. In step S2, an insulation layer is formed on the dielectric layer and in the concave portion. In step S3, a conductor is formed on the insulation layer. In step S4, the conductor is etched such that the conductor is located in the concave portion. In step S5, a sacrificial layer is formed on the dielectric layer, the insulation layer and the conductor. In step S6, a first portion of the sacrificial layer is implanted, wherein the sacrificial layer has a second portion that is not implanted. In step S7, the first portion of the sacrificial layer is removed such that the sacrificial layer has an opening exposing the conductor. In step S8, the second portion of the sacrificial layer and the conductor are etched such that the conductor has a first top surface and a second top surface, wherein the second top surface corresponds to the opening of the sacrificial layer in position, the first top surface corresponds to the second portion of the sacrificial layer in position, and the first top surface is closer to the dielectric layer than the second top surface. In the following description, the aforementioned steps will be described in detail.

Figure 3:
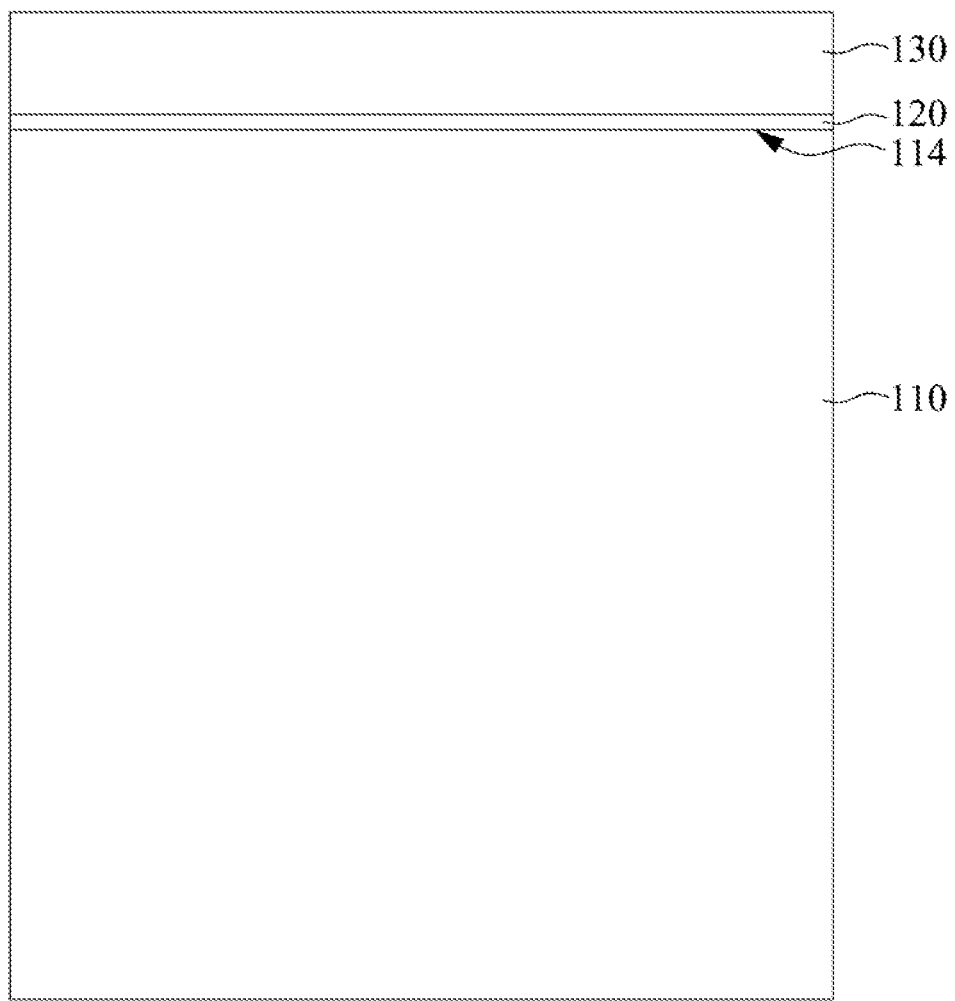
FIG. 3 to FIG. 12 illustrate cross-sectional views at various steps of a manufacturing method of a semiconductor structure according to one embodiment of the present disclosure.

FIG. 3 to FIG. 12 illustrate cross-sectional views at various steps of a manufacturing method of a semiconductor structure according to one embodiment of the present disclosure. Referring to FIG. 3, before forming the concave portion 112 in the substrate 110 (see FIG. 5), the isolation layer 120 and the dielectric layer 130 are formed on the top surface 114 of the substrate 110. The isolation layer 120 is located between the substrate 110 and the dielectric layer 130, and the isolation layer 120 and the dielectric layer 130 have different materials.

Figure 4:
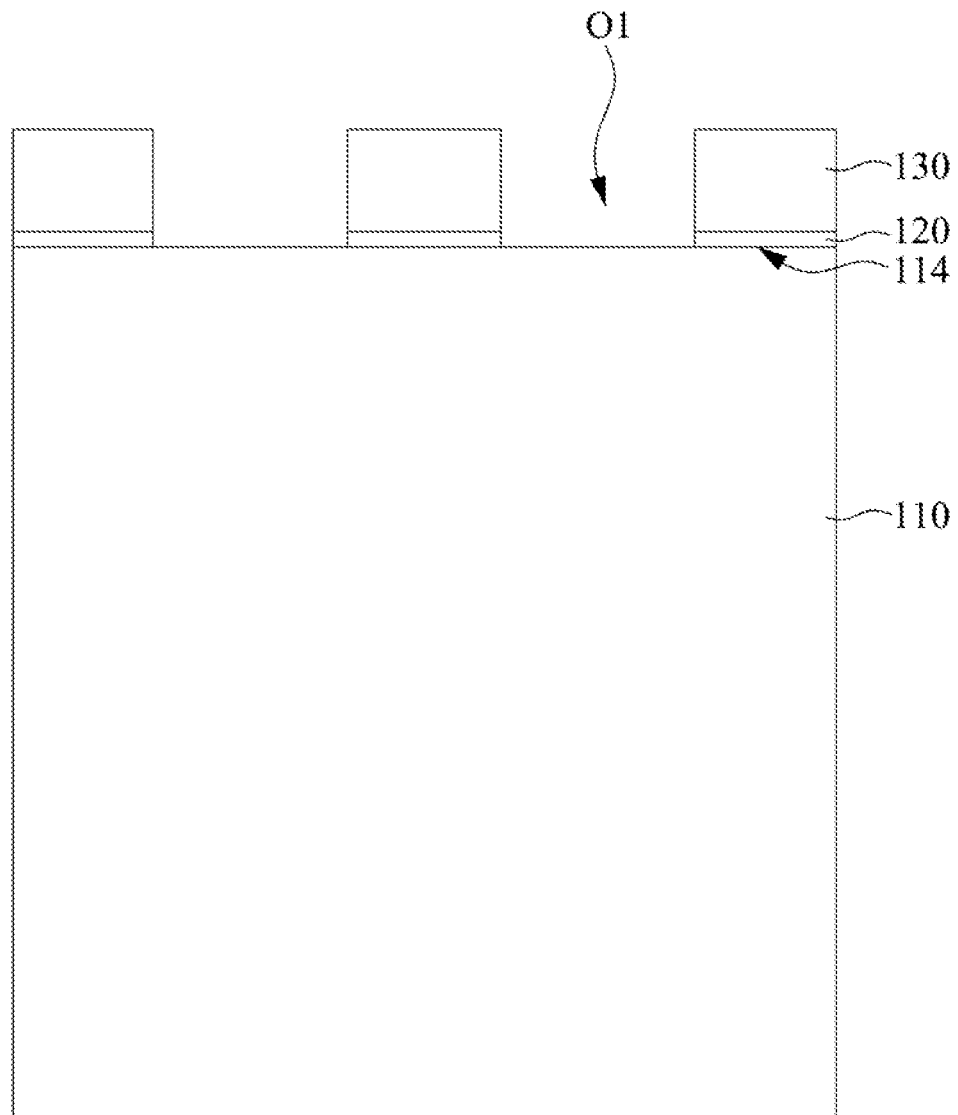
Figure 5:
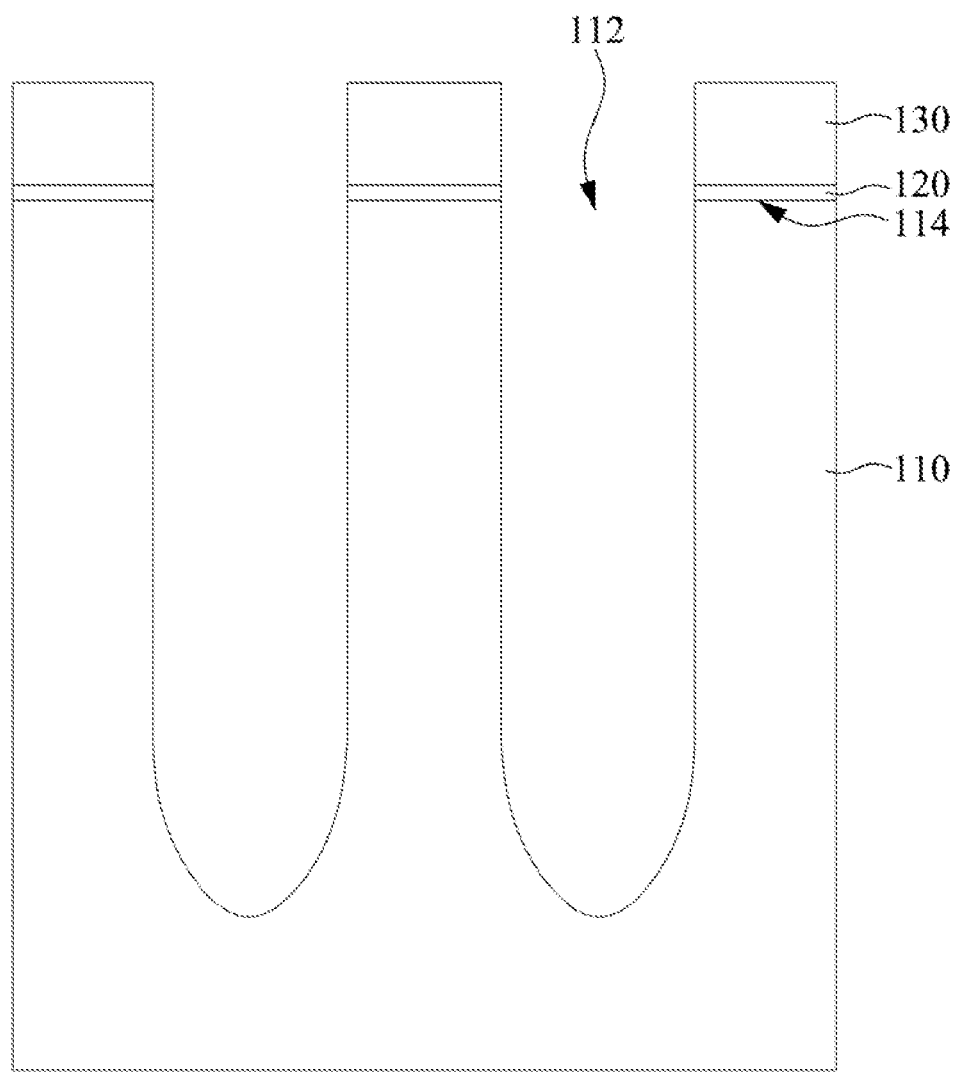

Referring to both FIG. 4 and FIG. 5, after the isolation layer 120 and the dielectric layer 130 are formed on the top surface 114 of the substrate 110, the isolation layer 120 and the dielectric layer 130 are patterned to form an opening O1 corresponding to the concave portion 112 in position. The remaining dielectric layer 130 serves as an etch mask. After the opening O1 is formed, the concave portion 112 is formed in the substrate 110, wherein the isolation layer 120 is located on the substrate 110, and the dielectric layer 130 is located on the isolation layer 120.

Figure 6:
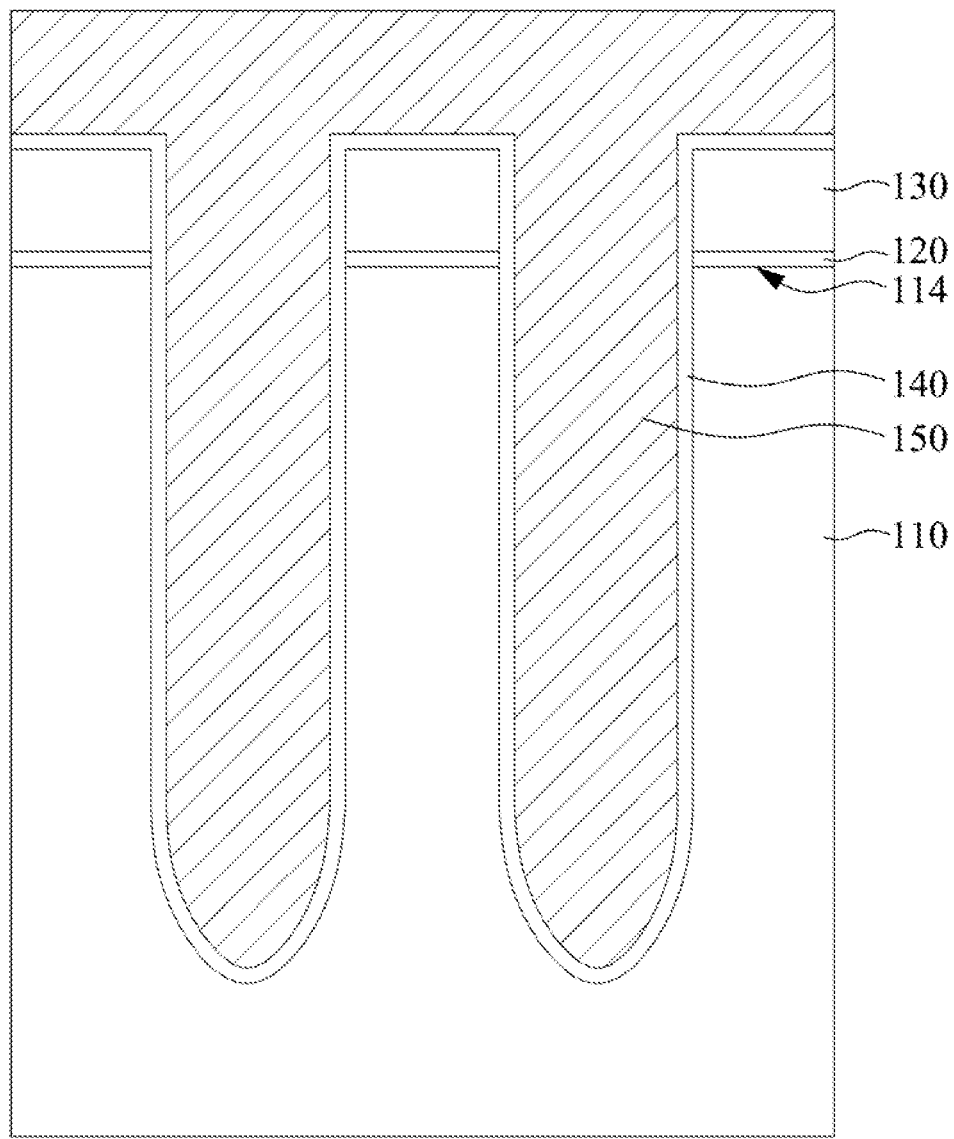
Figure 7:
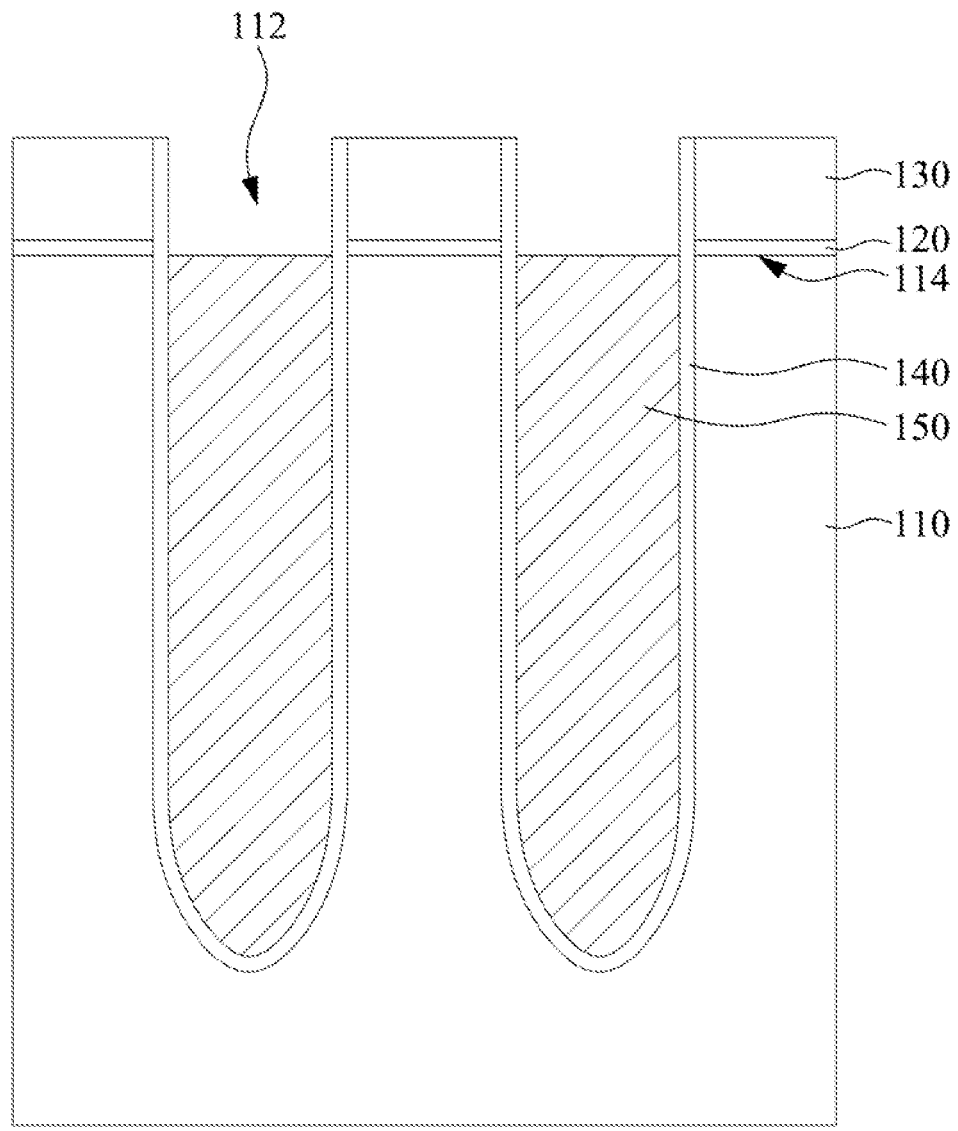

Referring to both FIG. 6 and FIG. 7, after the concave portion 112 is formed in the substrate 110, the insulation layer 140 is formed on the dielectric layer 130 and in the concave portion 112. Next, the conductor 150 is formed on the insulation layer 140. In one embodiment, the conductor 150 is formed on the insulation layer 140 so that the conductor 150 covers the top surface 114 of the substrate 110. Thereafter, the conductor 150 is etched so that the remaining conductor 150 is located in the concave portion 112. In other words, portions of the conductor 150 above the top surface 114 of the substrate 110 are removed.

Figure 8:
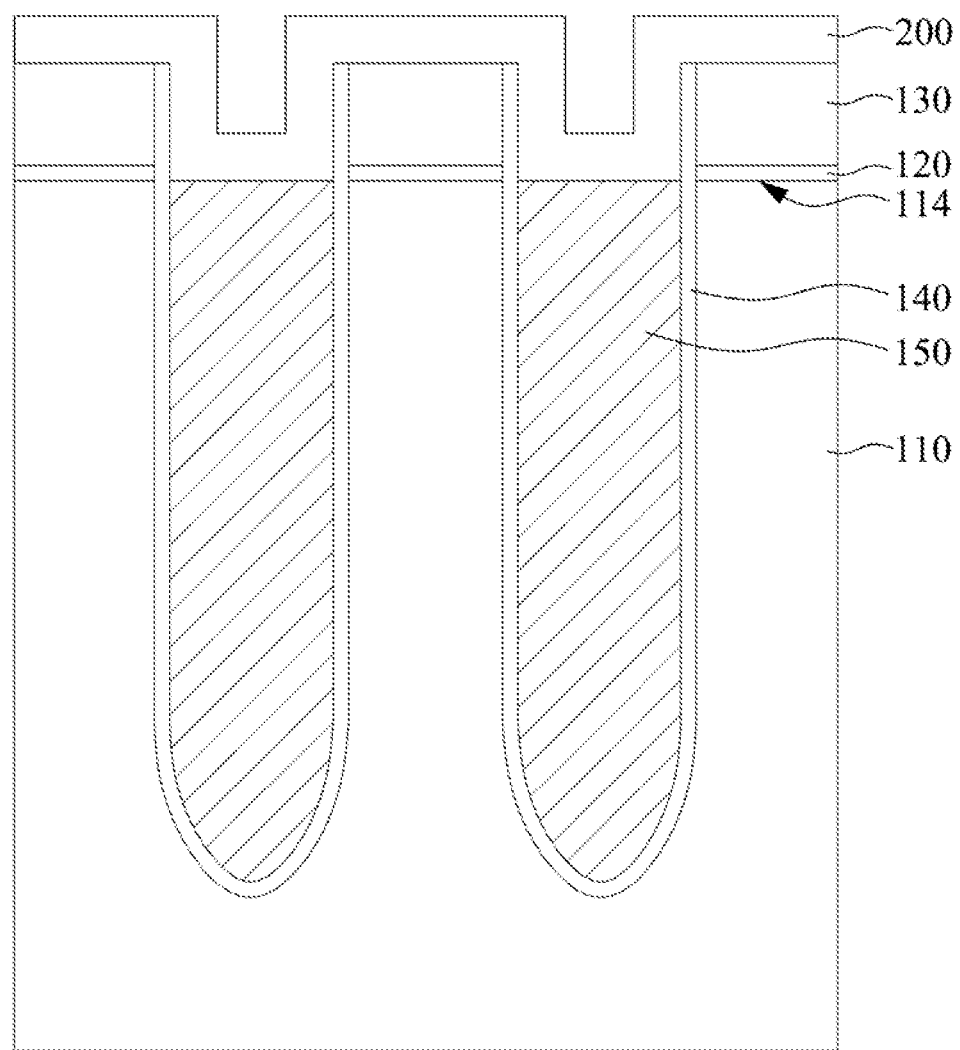

Referring to both FIG. 7 and FIG. 8, after the conductor 150 is etched, a sacrificial layer 200 is formed on the dielectric layer 130, the insulation layer 140 and the conductor 150. In detail, a deposition process is used to form the sacrificial layer 200 on the dielectric layer 130, the insulation layer 140 and the conductor 150, so the sacrificial layer 200 has a uniform thickness on the dielectric layer 130, the insulation layer 140, and the conductor 150. In addition, the sacrificial layer 200 is formed on the dielectric layer 130, the insulation layer 140 and the conductor 150 by tetraethoxysilane (TEOS).

Figure 9:
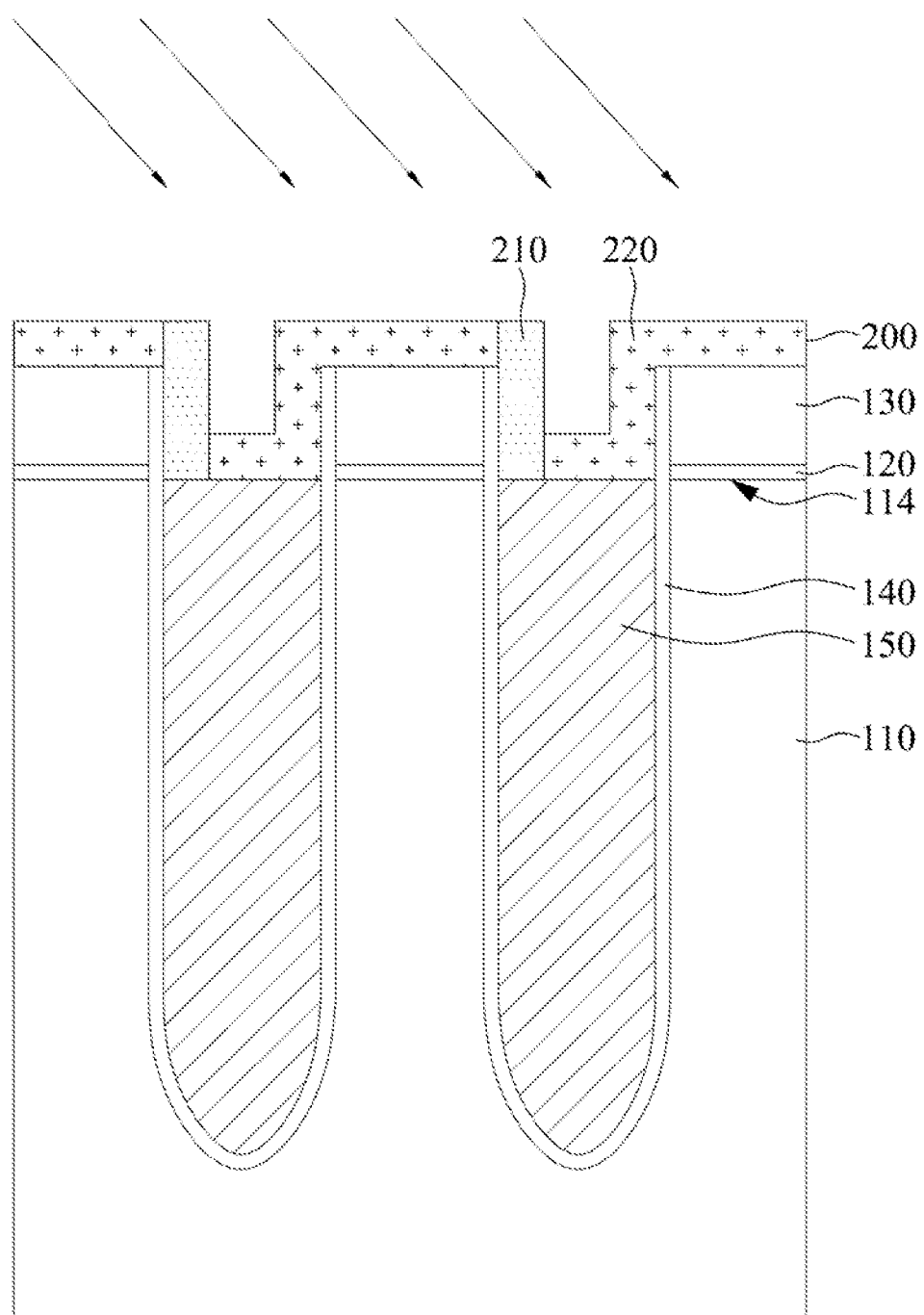
Figure 10:
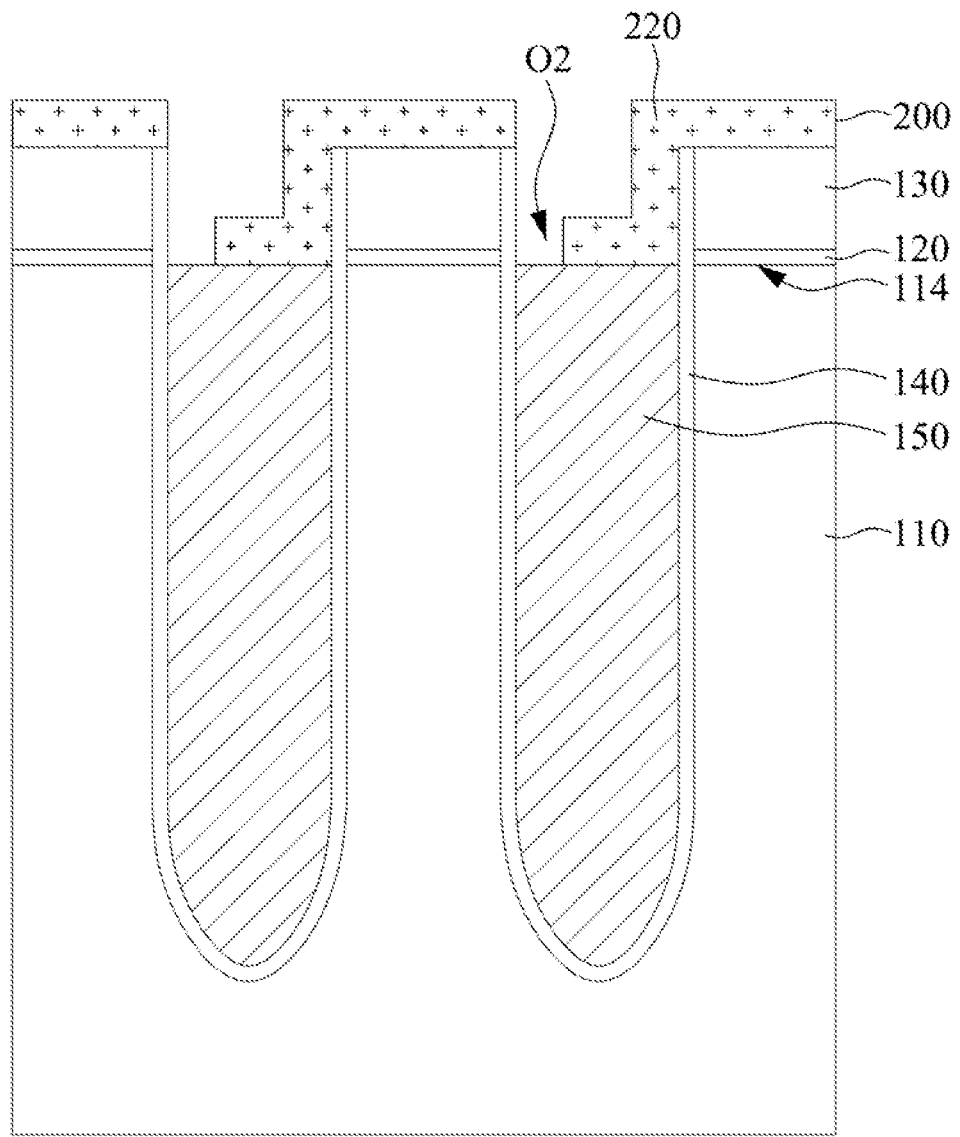

Referring to both FIG. 9 and FIG. 10, after the sacrificial layer 200 is formed, a first portion 210 of the sacrificial layer 200 is implanted, wherein the sacrificial layer 200 has a second portion 220 that is not implanted. After the first portion 210 of the sacrificial layer 200 is implanted, the first portion 210 and the second portion 220 of the sacrificial layer 200 have different etching rates.

In detail, the sacrificial layer 200 is implanted by tilt implanting such that the sacrificial layer 200 has the first portion 210 that is implanted and the second portion 220 that is not implanted. The etching rate of the first portion 210 that is implanted is faster than the etching rate of the second portion 220 that is not implanted. After the sacrificial layer 200 is implanted, the first portion 210 of the sacrificial layer 200 is removed such that the sacrificial layer 200 has an opening O2 exposing a portion of a top surface of the conductor 150.

Figure 11:
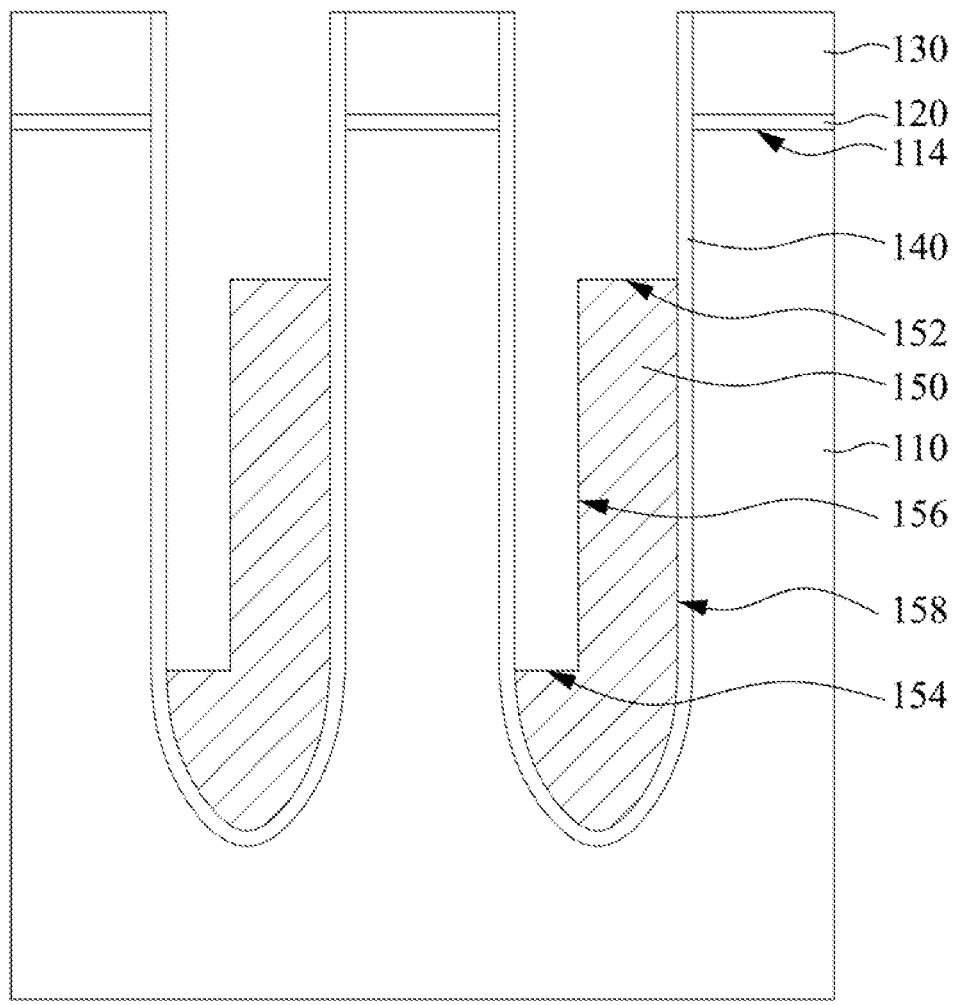

Referring to both FIG. 10 and FIG. 11, next, the second portion 220 of the sacrificial layer 200 and the conductor 150 are etched such that the conductor 150 has the first top surface 152 and the second top surface 154, wherein the second top surface 154 corresponds to the opening O2 of the sacrificial layer 200 in position, and the first top surface 152 corresponds to the second portion 220 of the sacrificial layer 200 in position, and the first top surface 152 is closer to the dielectric layer 130 than the second top surface 154 because the second top surface 154 is directly below the opening O2 and the first top surface 152 is directly below the second portion 220 of the sacrificial layer 200. The conductor 150 has the internal sidewall 156 adjoining to the first top surface 152 and the second top surface 154, and the first top surface 152, the second top surface 154 and the internal sidewall 156 of the conductor 150 define the stepped surface.

Figure 12:
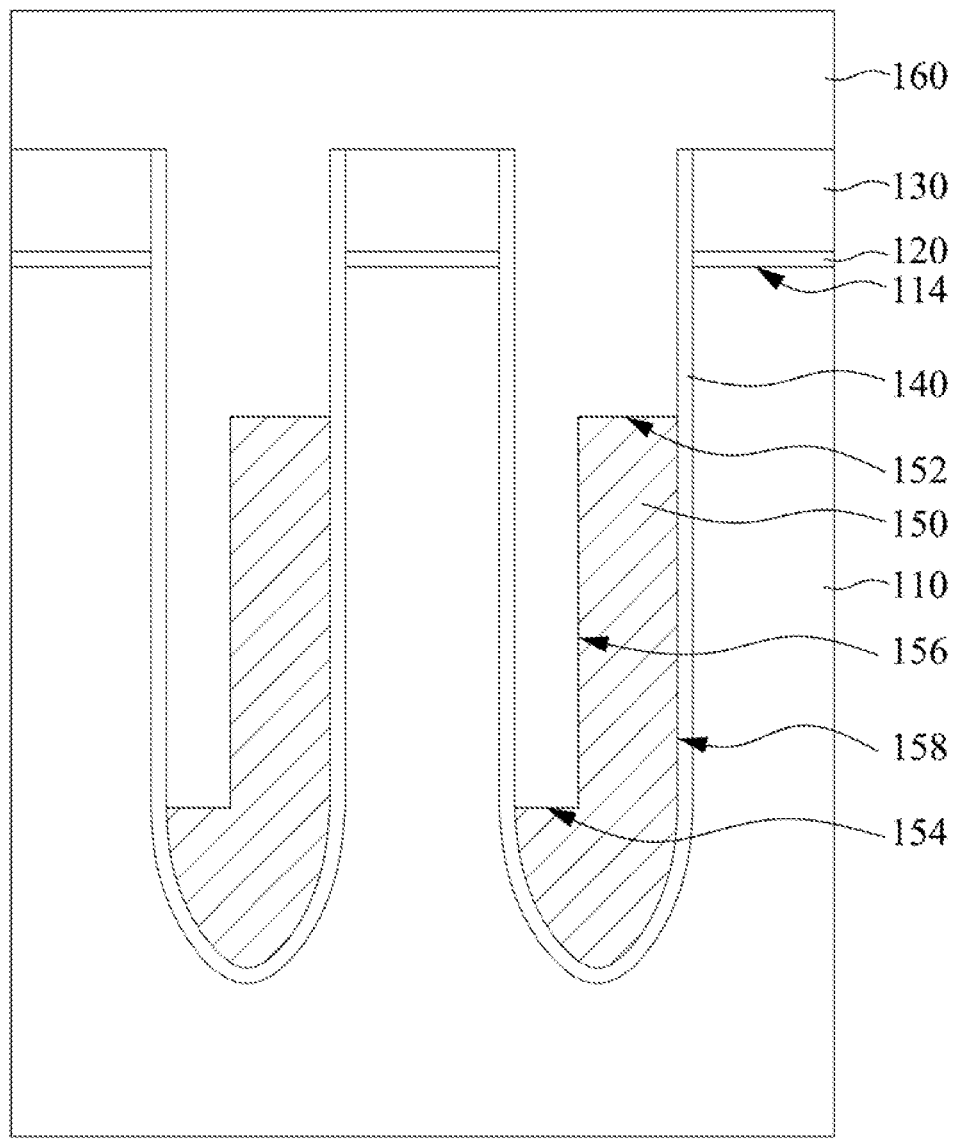

Referring to FIG. 12, next, the method of forming the semiconductor structure further includes forming the capping layer 160 on the conductor 150 and the dielectric layer 130. The capping layer 160 covers the dielectric layer 130, the insulation layer 140, and the conductor 150.

Referring to FIG. 12 and back to FIG. 1, the method of forming the semiconductor structure further includes etching the capping layer 160 such that the top surface 162 of the capping layer 160 is located in the concave portion 112 of the substrate 110. In one embodiment, the capping layer 160 is etched such that the distance d3 between the top surface 162 of the capping layer 160 and the first top surface 152 of the conductor 150 is smaller than the distance d4 between the top surface 162 of the capping layer 160 and the second top surface 154 of the conductor 150. The capping layer 160 of the semiconductor structure 100 has an internal sidewall adjoining to the first bottom surface 164 and the second bottom surface 166, and the first bottom surface 164, the second bottom surface 166 and the internal sidewall define another stepped surface. As a result, the semiconductor structure 100 shown in FIG. 1 can be obtained.

Although the present disclosure has been described in considerable detail with reference to certain embodiments thereof, other embodiments are possible. Therefore, the spirit and scope of the appended claims should not be limited to the description of the embodiments contained herein. In view of the foregoing, it is intended that the present disclosure covers modifications and variations of this disclosure provided they fall within the scope of the following claims.

What is claimed is:

1. A semiconductor structure, comprising:
    a substrate having a concave portion;
    an isolation layer located on a top surface of the substrate;
    a dielectric layer located on the isolation layer;
    an insulation layer located on a surface of the concave portion and extending to a sidewall of the isolation layer;
    a conductor located on the insulation layer in the concave portion, wherein the conductor has a first top surface and a second top surface, the first top surface is closer to the dielectric layer than the second top surface, and a distance between the first top surface of the conductor and the second top surface is greater than a distance between the second top surface of the conductor and a bottom of the conductor; and
    a capping layer located in the concave portion and covering the conductor.

2. The semiconductor structure of claim 1, wherein a width of the first top surface of the conductor is greater than a width of the second top surface.

3. The semiconductor structure of claim 1, wherein the conductor has an internal sidewall adjoining the first top surface and the second top surface, and the first top surface, the second top surface and the internal sidewall define a stepped surface.

4. The semiconductor structure of claim 1, wherein an external sidewall of the conductor adjoining the first top surface is in contact with the insulation layer.

5. The semiconductor structure of claim 1, wherein the capping layer has a top surface and a first bottom surface located on the first top surface, and a distance between the top surface of the capping layer and the first bottom surface is less than the distance between the first top surface of the conductor and the second top surface.

6. The semiconductor structure of claim 5, wherein the capping layer has a second bottom surface located on the second top surface, and a distance between the top surface of the capping layer and the second bottom surface is greater than the distance between the first top surface of the conductor and the second top surface.

7. The semiconductor structure of claim 6, wherein a width of the first bottom surface of the capping layer is greater than a width of the second bottom surface.

8. The semiconductor structure of claim 1, wherein the capping layer is located beneath the dielectric layer.

9. The semiconductor structure of claim 1, wherein an external sidewall of the capping layer is in contact with the insulation layer.

10. The semiconductor structure of claim 1, wherein the insulation layer is in contact with the sidewall of the isolation layer.

* * * * *